United States Patent [19]

Ogawa

[11] Patent Number: 4,894,580
[45] Date of Patent: Jan. 16, 1990

[54] CHIP-TYPE RESONATOR AND METHOD OF MANUFACTURING THE SAME

[75] Inventor: Toshio Ogawa, Kyoto, Japan

[73] Assignee: Murata Manufacturing Co., Ltd., Japan

[21] Appl. No.: 216,036

[22] Filed: Jul. 7, 1988

[30] Foreign Application Priority Data

Jul. 7, 1987 [JP] Japan ................................ 62-170330

[51] Int. Cl.⁴ ........................................... H01L 41/08
[52] U.S. Cl. .................................... 310/320; 310/366; 310/358
[58] Field of Search ............... 310/358, 359, 366, 328, 310/331, 332

[56] References Cited

U.S. PATENT DOCUMENTS

| | | | |
|---|---|---|---|
| Re. 27,116 | 4/1971 | Miller | 310/358 |
| 3,590,287 | 6/1971 | Berlincourt et al. | 310/358 |
| 4,240,003 | 12/1980 | Larson, III | 310/326 |
| 4,564,782 | 1/1986 | Ogawa | 310/359 |
| 4,593,160 | 6/1986 | Nakamura | 310/359 X |
| 4,649,313 | 3/1987 | Ogawa et al. | 310/358 |
| 4,742,264 | 5/1988 | Ogawa | 310/332 |

FOREIGN PATENT DOCUMENTS 85613 5/1983 Japan.

Primary Examiner—Mark O. Budd
Attorney, Agent, or Firm—Ostrolenk, Faber, Gerb & Soffen

[57] ABSTRACT

A chip-type resonator comprises a piezoelectric member, a plurality of inner electrodes embedded in the piezoelectric member parallel to one another and spaced apart at intervals along the direction of thickness, and a pair of outer electrodes provided on side surfaces of the piezoelectric member and connected with the inner electrodes. The inner electrodes are provided in an odd number of at least three. The piezoelectric member is so polarized that one of its portions located between one pair of the inner electrodes expands and another portion between an adjacent pair contracts upon application of voltage between the outer electrodes.

This chip-type resonator is manufactured by preparing a plurality of sheets for providing a piezoelectric member, forming electrodes on the same, stacking and firing the same and performing the prescribed polarization.

7 Claims, 1 Drawing Sheet

CHIP-TYPE RESONATOR AND METHOD OF MANUFACTURING THE SAME

BACKGROUND OF THE INVENTION

1. Field of the Invention

The present invention relates to a chip-type resonator and a method of manufacturing the same, and more particularly, it relates to a chip-type resonator (the term "resonator" includes a vibrator throughout the specification) utilizing vibration of a piezoelectric member and a method of manufacturing the same.

2. Description of the Prior Art

As shown in FIG. 1, a conventional chip-type resonator comprises a piezoelectric member 1, a pair of inner electrodes 2 and 3 embedded in the piezoelectric member 1 and a pair of outer electrodes 4 and 5 provided on side surfaces of the piezoelectric member 1. The pair of inner electrodes 2 and 3 are arranged to be parallel to each other and spaced apart by a distance in the direction of thickness of the member 1. One of the inner electrodes 2 and 3 is connected to the outer electrode 4 and the other one is connected to the outer electrode 5. Further, the piezoelectric member 1 is polarized in the direction shown by an arrow. The chip-type resonator of such structure is disclosed in Japanese Patent Laying-Open Gazette No. 85613/1983 and in a paper titled "Energy Trapping Type Ceramic Vibrator Having Inner Electrodes", 7th Symposium on Ultrasonic Electronics, Dec. 1986, Kyoto, pp. 125–126.

When voltage of a prescribed frequency is applied between the outer electrodes 4 and 5, a portion of the piezoelectric member 1 between the inner electrodes 2 and 3 expands or contracts to cause resonance of the chip-type resonator.

Upon such resonance of the piezoelectric member 1 between the inner electrodes 2 and 3, vibration energy is transmitted toward major surfaces 6 and 7 of the piezoelectric member 1. Therefore, the vibration energy generated between the inner electrodes 2 and 3 is not trapped between the inner electrodes 2 and 3 but leaks to the exterior of the resonator. Thus, when the aforementioned conventional chip-type resonator is directly face-bonded on a substrate, a desired resonance characteristic cannot be obtained because of turbulence in its response.

SUMMARY OF THE INVENTION

An object of the present invention is to provide a chip-type resonator which can apparently trap vibration in the interior of a chip by combining vibration modes of the resonator, thereby to obtain a desired resonance characteristic.

Another object of the present invention is to provide a method of manufacturing such a chip-type resonator.

The chip-type resonator according to the present invention comprises a piezoelectric member, a plurality of inner electrodes embedded in the piezoelectric member parallel to each other and having distance therebetween in the direction of thickness of the member, and a pair of outer electrodes provided on side surfaces of the piezoelectric member and be connected with the inner electrodes. The inner electrodes are provided in an odd number of at least three. The piezoelectric member is so polarized that one of its portions located between a given pair of the inner electrodes expands and another portion between an adjacent pair of inner electrodes contracts when voltage is applied between the outer electrodes.

In this case, preferably the inner electrodes are alternately connected to the outer electrodes, extending in opposite directions, and the portions of the piezoelectric member are polarized in the same direction.

When voltage of a prescribed frequency is applied between the outer electrodes, each portion of the piezoelectric member between a respective pair of inner electrodes expands or contracts, to vibrate the piezoelectric member.

Since the inner electodes are provided in an odd number of at least three, the portions of the piezoelectric member located between adjacent pairs of the inner electrodes are in an even number. Further, the piezoelectric member is so polarized that its portion located between a given pair of the inner electrodes expands and the other portion between and adjacent pair of inner electrodes contracts when voltage is applied between the outer electrodes, whereby such expansion and contraction of the adjacent portions of the piezoelectric member cancel out each other. Therefore, even if the portions between the pairs of the inner electrodes vibrate, the chip-type resonator is apparently in a nonvibrating state as a whole. In other words, the vibration energy of the piezoelectric member generated between the pairs of inner electrodes is trapped in the resonator, so there is no leakage to the exterior.

Thus, the chip-type resonator according to the present invention has a sharp response, whereby it obtains a desired resonance frequency characteristic.

In a method of manufacturing a chip-type resonator according to the present invention, calcined powder of piezoelectric material is first pulverized with a binder and then slurried. A plurality of sheets are formed from the slurry thus obtained. A conductive paste for forming the inner electrodes is provided on the sheets. Then the sheets are stacked and pressed so that the inner electrodes are in an odd number of at least three. The sheets thus stacked are fired. Outer electrodes are provided on the fired body thus obtained, and are connected with the inner electrodes. The fired body is so polarized that one of its portions located between a given pair of the inner electrodes expands and the other portion, between an adjacent pair of inner electrodes, contracts when voltage is applied between the outer electrodes.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
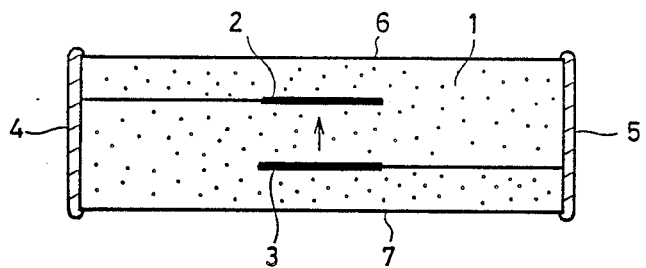
FIG. 1 is a longitudinal sectional view showing a conventional chip-type resonator.
Figure 2:
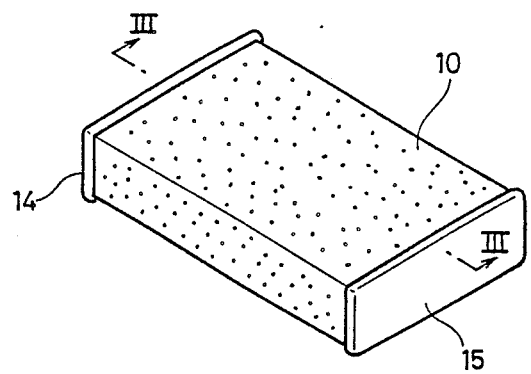
FIG. 2 is a perspective view showing an embodiment of the present invention.
Figure 3:
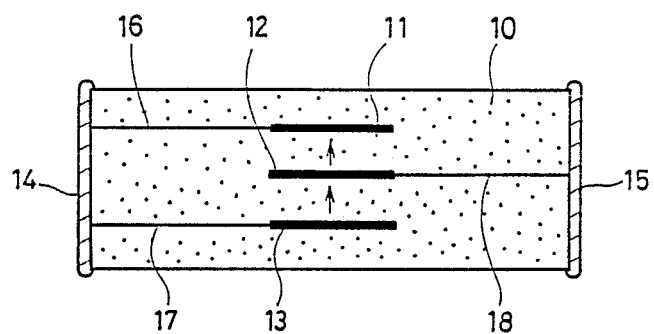
FIG. 3 is a sectional view taken along the line III—III in FIG. 2.

FIGS. 2 and 3 show an embodiment of a chip-type resonator according to the present invention. Referring to FIGS. 2 and 3, the chip-type resonator of this embodiment comprises a piezoelectric member 10 in the form of a substantially rectangular plate, three inner electrodes 11, 12 and 13 embedded in the piezoelectric member 10 and outer electrodes 14 and 15 provided on side surfaces of the piezoelectric member 10.

This embodiment utilizes the primary wave of lead titanate zirconate piezoelectric ceramics (PZT), or the third overtone wave of lead titanate piezoelectric ceramics (LT) or lead metaniobate ceramics (PbNO$_5$), for example. Evaluation was made of $0.05Pb(Sn_{\frac{1}{2}}Sb_{\frac{1}{2}})O_3-0.45PbTiO_3-0.40PbZrO_3+0.7$ wt.%MnO$_2$, as a typical example of PZT for forming the piezoelectric member 10. As to a typical example of LT, evaluation was made of $Pb_{0.85}La_{0.1}TiO_3+1.0$ wt.%MnO$_2$. In the case of utilizing the third overtone wave of LT, an available frequency range can be further increased.

The inner electrodes 11, 12 and 13 are arranged parallel to one another and spaced at regular intervals in the direction of thickness. The inner electrodes 11 and 13 are electrically connected to the outer electrode 14 through lead portions 16 and 17. The remaining inner electrode 12 is electrically connected to the other outer electrode 15 through a lead portion 18. A portion of the piezoelectric member 10 between the inner electodes 11 and 12 and another portion between the inner electrodes 12 and 13 are polarized in the same direction, as shown by arrows.

The chip-type resonator according to the present invention is manufactured as follows: First, calcined fired powder of PZT or LT is pulverized with a binder and slurried. Then, a sheet of 10 to 200 μm in thickness is prepared by a doctor blade method. A conductive paste of electrode material containing at least one of Au, Pt, Pd or Ag is printed on the sheet by screen printing. The sheets thus printed with conductive paste are stacked in prescribed structure and pressed with each other under pressure by rubber pressing, cold isostatic pressing or the like, and thereafter fired. The fired body is provided with electrodes for polarization, and polarized under conditions of 80° C. 3.0 KV/mm and 30 minutes. The chip-type resonator as shown in FIG. 2 is thus obtained.

The operation of the chip-type resonator will now be described.

When the outer electrode 14 is positively charged and the outer electrode 15 is negatively charged, for example, the portion of the piezoelectric member 10 between the inner electrodes 11 and 12 contracts and that between the inner electrodes 12 and 13 expands. On the other hand, when the outer electrode 14 is negatively charged and the outer electrode 15 is positively charged, the portion between the inner electrodes 11 and 12 expands and that between the inner electrodes 12 and 13 contracts. In other words, the respective modes of vibration between the inner electrodes 1 and 12 and between the inner electrodes 12 and 13 comprise a combination of expansion and contraction. Considering the entire chip-type resonator as a whole, therefore, the piezoelectric member 10 is apparently in a stationary state with neither expansion nor contraction.

Thus, even if voltage of a prescribed frequency is applied between the outer electrodes 14 and 15, the entire chip-type resonator is apparently in a non-vibrating state, although the portions between the inner electrodes 11 and 12 and between the inner electrodes 12 and 13 are transformed. Therefore, vibration energy does not leak to the exterior but is trapped in the resonator. Consequently, the chip-type resonator according to the present invention has a sharp resonance waveform, whereby it obtains a desired resonance frequency characteristic.

Table 1 shows the results of an experiment made to compare samples of the present invention with reference examples.

TABLE 1

| No. | Composition | Number n of Electrodes | Electrode Interval | Judgement | Resonance Frequency fr |
|---|---|---|---|---|---|
| 1 | PZT | 2 | 50 μm | bad | kHz |
| 2 | " | 3 | 100 | good | 24.835 |
| 3 | " | 5 | 100 | good | 24.521 |
| 4 | LT | 2 | 100 | bad | — |
| 6 | " | 3 | 50 | good | 138.142 |
| 7 | " | 3 | 50 | good | 137.954 |
| 8 | " | 4 | 100 | bad | — |
| 9 | " | 5 | 75 | good | 92.463 |
| 10 | " | 7 | 75 | good | 92.658 |

Referring to Table 1, samples Nos. 1, 4 and 8 indicate reference examples. Symbol "-" in the column of Resonance Frequency fr indicates that it was impossible to decide the resonance frequency fr because of turbulence in response. As seen from Table 1, a desired resonance frequency characteristic was obtained in each sample of the present invention with a sharp resonance waveform, while it was impossible to evaluate the resonance frequency characteristic in each of the reference examples, because of turbulence in the resonance waveform.

In the present invention, the number of the inner electrodes is not restricted to three as in the aforementioned embodiment. The present invention can also be carried out if three or geater number of inner electrodes are provided in a piezoelectric member as in the sample No. 3, 9 or 10 in Table 1, for example.

According to the present invention as hereinabove described, an odd number of at least three or more odd inner electrodes are provided and a piezoelectric member is so polarized that one of its portions located between a given pair of the inner electrodes expands and another portion between an adjacent pair of inner electrodes contracts when voltage is applied between outer electrodes to provide vibration modes in combination of expansiion and contraction in the piezoelectric member, whereby the resonator is apparently in a non-vibrating state. Thus, no vibration energy leaks to the exterior of the piezoelectric member, so that a desired resonance frequency characteristic is obtained on the basis of a sharp resonance response with no spurious output.

Although an embodiment of the present invention has been described and illustrated in detail, it is clearly understood that the same is by way of illustration and example only and is not to be taken by way of limitation, the spirit and scope of the present invention being limited only by the terms of the appended claims.

What is claimed is:

1. A chip-type resonator comprising:
   a piezoelectric member;
   a plurality of inner electrodes embedded in the interior of said piezoelectric member parallel to one another and spaced apart at inervals along the direction of thickness of the member, said inner electrodes being provided in an odd number of at least three; and
   a pair of outer electrodes provided on opposite side surfaces of said piezoelectric member and connected with said inner electrodes, said inner electrodes being alternately connected to said outer electrodes, by leads extending alternately in opposite directions;

said portions of said piezoelectric member between said one pair and each said adjacent pair of inner electrodes being polarized in the same direction, so that when any one portion thereof located between one pair of the inner electrodes expands, each adjacent portion between each adjacent pair of the inner electrodes simultaneously contracts upon application of voltage between said outer electrodes, and said simultaneous expansion and contraction of said portions cancel each other, so that the chip-type resonator remains outwardly in a non-vibrating state as a whole and said expansion and contraction do not substantially cause vibration of the exterior of the chip-type resonator.

2. A chip-type resonator in accordance with claim 1, wherein said piezoelectric member consists essentially of a material selected from the group consisting of lead titanate zirconate piezoelectric ceramics, lead titanate piezoelectric ceramics, and lead metaniobate ceramics.

3. A chip-type resonator in accordance with claim 2, wherein the number of said inner electrodes is 3 to 7, and the interval between each pair of adjacent said inner electrodes is 50 to 100 μm.

4. A chip-type resonator in accordance with claim 3, wherein said inner electrodes consist essentially of a metal selected from the group consisting of Au, Pt, Pd and Ag.

5. A chip-type resonator comprising:

a piezoelectric member;

a plurality of inner electrodes embedded in said piezoelectric member parallel to one another and spaced apart at intervals along the direction of thickness of the member, said inner electrodes being provided in an odd number of at least three; and a pair of outer electrodes provided on side surfaces of said piezoelectric member and connected with said inner electrodes, wherein each pair of adjacent inner electrodes defines a respective inner portion of said piezoelectric member; and each of said inner portions is polarized such that a voltage applied across said outer electrodes simultaneously causes expansion of a first one of said inner portions, and contraction of each said inner portion that is adjacent to said first inner portion.

6. A chip-type resonator in accordance with claim 3, wherein said pairs of adjacent inner electrodes are spaced apart by a constant interval.

7. A chip-type resonator comprising:

a piezoelectric member;

a plurality of inner electrodes embedded in said piezoelectric member parallel to one another and spaced apart at intervals along the direction of thickness of the member, said inner electrodes being provided in an odd number of at least three; and a pair of outer electrodes provided on side surfaces of said piezoelectric member and connected with said inner electrodes, wherein each pair of adjacent inner electrodes defines a respective inner portion of said piezoelectric member; and said inner portions are polarized in the same direction, such that a voltage applied across said outer electrodes simultaneously causes expansion of a first one of said inner portions, and contraction of each said inner portion that is adjacent to said first inner portion.

* * * * *